United States Patent
Kwan et al.

(10) Patent No.: US 8,014,485 B2
(45) Date of Patent: Sep. 6, 2011

(54) TECHNIQUES FOR INTEGRATED CIRCUIT CLOCK MANAGEMENT USING MULTIPLE CLOCK GENERATORS

(75) Inventors: Bill K. C. Kwan, Austin, TX (US); Craig Eaton, Austin, TX (US); Daniel W. Bailey, Austin, TX (US)

(73) Assignee: Advanced Micro Devices, Inc., Sunnyvale, CA (US)

(*) Notice: Subject to any disclaimer, the term of this patent is extended or adjusted under 35 U.S.C. 154(b) by 928 days.

(21) Appl. No.: 11/750,290

(22) Filed: May 17, 2007

(65) Prior Publication Data
US 2008/0285696 A1  Nov. 20, 2008

(51) Int. Cl.
H03D 3/24  (2006.01)
(52) U.S. Cl. ........................................ 375/376
(58) Field of Classification Search .............. 375/242, 375/316, 354, 371, 373, 376, 142, 150, 152, 375/222, 327, 355, 359; 327/146, 147, 156, 327/162, 295, 114, 217, 291, 298, 407
See application file for complete search history.

(56) References Cited

U.S. PATENT DOCUMENTS

| | | | |
|---|---|---|---|
| 4,031,476 A | 6/1977 | Goldberg | |
| 4,264,863 A | 4/1981 | Kojima | |
| 4,344,036 A | 8/1982 | Dakroub et al. | |
| 4,590,602 A | 5/1986 | Wolaver | |
| 4,600,895 A | 7/1986 | Landsman | |
| 4,758,945 A | 7/1988 | Remedi | |
| 5,151,986 A | 9/1992 | Langan et al. | |
| 5,189,647 A | 2/1993 | Suzuki et al. | |
| 5,233,316 A | 8/1993 | Yamada et al. | |
| 5,268,656 A | 12/1993 | Muscavage | |
| 5,291,070 A | 3/1994 | Witt | |
| 5,586,308 A * | 12/1996 | Hawkins et al. | 713/501 |
| 5,652,536 A | 7/1997 | Nookala et al. | |
| 5,710,929 A * | 1/1998 | Fung | 713/322 |
| 5,828,869 A | 10/1998 | Johnson et al. | |
| 6,021,500 A | 2/2000 | Wang et al. | |
| 6,157,265 A | 12/2000 | Hanjani | |
| 6,281,721 B1 | 8/2001 | Kinget et al. | |
| 6,281,759 B1 | 8/2001 | Coffey | |
| 6,316,982 B1 | 11/2001 | Gutierrez, Jr. | |
| 6,359,486 B1 | 3/2002 | Chen | |
| 6,385,126 B2 * | 5/2002 | Jung et al. | 365/233.11 |
| 6,411,135 B2 | 6/2002 | Komoto | |

(Continued)

OTHER PUBLICATIONS

Actions on the Merits by the U.S.P.T.O as of Jun. 24, 2009, 2 pages.

(Continued)

*Primary Examiner* — Dac V Ha
*Assistant Examiner* — Syed Haider

(57) ABSTRACT

A clock generator system (400) includes a phase locked loop (PLL) (402), a first clock generator (404), and a second clock generator (406). The PLL (402) includes a first output configured to provide a first clock signal at a first frequency and a second output configured to provide a second clock signal at the first frequency. The second clock signal is out-of-phase with the first clock signal. An output of the first clock generator (404) is configured to provide a first generated clock signal whose effective frequency is based on both the first and second clock signals and a first mode signal. An output of the second clock generator (406) is configured to provide a second generated clock signal whose effective frequency is based on both the first and second clock signals and a second mode signal.

20 Claims, 8 Drawing Sheets

U.S. PATENT DOCUMENTS

| | | | |
|---|---|---|---|
| 6,584,571 | B1 | 6/2003 | Fung |
| 6,600,355 | B1 | 7/2003 | Nguyen |
| 6,694,389 | B2 | 2/2004 | Coates et al. |
| 6,715,094 | B2 | 3/2004 | Jacobs |
| 6,983,354 | B2 | 1/2006 | Jeddeloh |
| 7,319,345 | B2 | 1/2008 | Farjad-rad et al. |
| 7,366,803 | B1 | 4/2008 | Gaither et al. |
| 7,414,443 | B2 | 8/2008 | Jacobsson et al. |
| 7,456,674 | B2 | 11/2008 | Oakland |
| 7,460,565 | B2 | 12/2008 | Dally et al. |
| 7,675,338 | B2 | 3/2010 | Boerstler et al. |
| 2002/0140486 | A1 | 10/2002 | Boerstler et al. |
| 2002/0154723 | A1* | 10/2002 | Nakamura .................. 375/376 |
| 2004/0008725 | A1* | 1/2004 | McNamara et al. ......... 370/466 |
| 2004/0017243 | A1* | 1/2004 | Sasaki ........................ 327/295 |
| 2004/0119521 | A1* | 6/2004 | Kurd et al. .................. 327/291 |
| 2005/0195009 | A1 | 9/2005 | Mack et al. |
| 2006/0120498 | A1* | 6/2006 | Wong et al. ................. 375/359 |
| 2007/0147566 | A1* | 6/2007 | Laturell et al. .............. 375/355 |
| 2008/0094117 | A1 | 4/2008 | Stoler et al. |

OTHER PUBLICATIONS

Actions on the Merits by the U.S.P.T.O. as of Aug. 26, 2008, 1 page.
Actions on the Merits by the U.S.P.T.O. as of Apr. 23, 2009, 1 page.
Chakraborty et al., "Efficient Self-Timed Interfaces for Crossing Clock Domains," Proceedings of the 9th International Symposium on Asynchronous Circuits and Systems, IEEE 2003, pp. 1-11.
Chelcea et al., "A Low-Latency FIFO for Mixed-Clock Systems," Department of Computer Science, Columbia University, 8 pages.
Chelcea et al., "Robust Interfaces for Mixed-Timing Systems," IEEE Transactions on Very Large Scale Integration (VLSI) Systems, vol. 12, No. 8, Aug. 2004, p. 857-873.
Messerschmitt, David G., "Synchronization in Digital System Design," IEEE Journal on Selected Areas in Communications, vol. 8, No. 8, Oct. 1990, pp. 1404-1419.
Seizovic, Jakov N., "Pipeline Synchronization," Myricom, Inc., 0-8186-6210-7/94, IEEE 1994, pp. 87-96.
PCT International Search Report for PCT/2008/006342, 3 pages.
Action on the Merits by the U.S.P.T.O. as of Dec. 11, 2008, 1 page.
U.S. Appl. No. 11/528,947, Notice of Allowance mailed Aug. 6, 2009, 8 pgs.
U.S. Appl. No. 11/528,947, filed Sep. 28, 2006, entitled "Device and Method for Transferring Data Between Devices."
U.S. Appl. No. 12/613,837, filed Nov. 6, 2009, entitled "Device and Method for Transferring Data Between Devices."
U.S. Appl. No. 11/750,267, filed May 17, 2007, entitled "Techniques for Integrated Circuit Clock Management."
U.S. Appl. No. 11/750,284, filed May 17, 2007, entitled "Techniques for Integrated Circuit Clock Management Using Pulse Skipping."
U.S. Appl. No. 11/750,275, filed May 17, 2007, entitled "Techniques for Integrated Circuit Clock Signal Manipulation to Facilitate Functional and Speed Test."
U.S. Appl. No. 12/409,228 filed Mar. 23, 2009, entitled "Digital Frequency Synthesizer Device and Method Thereof."
U.S. Appl. No. 11/750,267, Office Action mailed Jul. 1, 2009, 5 pgs.
U.S. Appl. No. 11/750,267, Final Office Action mailed Oct. 23, 2009, 5 pgs.
U.S. Appl. No. 11/750,275, Notice of Allowance mailed Nov. 17, 2009, 4 pages.
U.S. Appl. No. 11/750,284, Non-Final Office Action mailed Jan. 15, 2010, 28 pages.
U.S. Appl. No. 11/750,267, Notice of Allowance mailed Feb. 1, 2010, 7 pages.
TDB-ACC-No. NA9002345, title "Dynamic clock frequency changing for a memory controller" dated Feb. 1, 1990.
U.S. Appl. No. 11/750,284, Notice of Allowance mailed Aug. 12, 2010, 7 pages.
Notice of Allowance mailed Nov. 24, 2010 for U.S. Appl. No. 11/750,284, 7 pages.
Final Office Action mailed Mar. 30, 2011 for U.S. Appl. No 12/409,228, 16 pages.
Non-Final Office Action mailed Oct. 15, 2010 for U.S. Appl. No. 12/409,228, 27 pages.
Non-Final Office Action mailed Mar. 7, 2011 for U.S. Appl. No. 12/613,837, 27 pages.

* cited by examiner

TECHNIQUES FOR INTEGRATED CIRCUIT CLOCK MANAGEMENT USING MULTIPLE CLOCK GENERATORS

CROSS-REFERENCE TO RELATED APPLICATION(S)

The present application is related to co-pending U.S. patent application Ser. No. 11/750,267, entitled "TECHNIQUES FOR INTEGRATED CIRCUIT CLOCK MANAGEMENT" filed on May 17, 2007, by Craig Eaton et al., U.S. patent application Ser. No. 11/750,284, entitled "TECHNIQUES FOR INTEGRATED CIRCUIT CLOCK MANAGEMENT USING PULSE SKIPPING" filed on May 17, 2007, by Bill K. C. Kwan et al., U.S. patent application Ser. No. 11/750,275, entitled "TECHNIQUES FOR INTEGRATED CIRCUIT CLOCK SIGNAL MANIPULATION TO FACILITATE FUNCTIONAL AND SPEED TEST" filed on May 17, 2007, by Atchyuth Gorti, all of which are incorporated herein by reference in their entirety.

BACKGROUND

1. Field of the Disclosure

The present disclosure is generally directed to clock management and, more particularly, to techniques for integrated circuit clock management using multiple clock generators.

2. Description of the Related Art

Traditionally, power management of computer systems has been implemented by adjusting a system clock frequency (and frequently an associated voltage of a system clock) to achieve optimal (or near optimal) power savings at a given performance level. Typically, the system clock frequency has been adjusted by changing a frequency of a phase locked loop (PLL), which has provided the system clock. Unfortunately, when a frequency of a PLL is adjusted there may be a latency of several hundred microseconds before the PLL re-locks and the system can resume normal operation. In processor systems that employ multiple PLLs, each of which provide respective clock signals for various subsystems, the system latency may assume the latency of the PLL with the greatest re-locking latency. Moreover, in systems employing multiple PLLs, synchronization of respective clock signals provided by the PLLs may require relatively sophisticated design solutions.

Traditionally, power management of computer systems has been facilitated by a number of different techniques. For example, legacy computer systems have implemented advanced power management (APM) compliant designs that employed operating system (OS) control of power management, via a basic input output system (BIOS). Today, most computer systems employ advanced configuration and power interface (ACPI) compliant designs to facilitate power management. The ACPI specification provides for OS control of system power management via a BIOS, which provides the OS with methods for directly controlling low-level hardware details, such that the OS has nearly complete control over power savings. In general, the ACPI specification facilitated the introduction of power management features, which were previously only available in portable computers, to desktop computers and servers. For example, a computer system may be put into extremely low-energy states from which ordinary interrupts can quickly wake the system.

The ACPI specification defines seven states (G0, G1-S1, G1-S2, G1-S3, G1-S4, G2, and G3) for an ACPI-compliant computer system. The G0 state is the normal working state of the computer system. In the G0 state a central processing unit (CPU) may execute instructions or repeatedly transition into and out of low-energy states, e.g., C0-Cn and D0-D3. For example, laptop computer systems routinely power down all currently unused devices when battery-powered. The G1 state is subdivided into four sleep modes S1 through S4. The time needed to bring the system from state G1 to state G0 is shortest for the S1 mode, which is the most power-hungry of the sleep modes. The G2 state is almost the same as the G3 state (mechanical off), but in the G2 state some components remain powered so the computer can "wake" in response to input from a keyboard, a local area network (LAN) device, or a universal serial bus (USB) device, etc. The G2 state is typically initiated by the OS in response to a user issued shut-down command. The device states D0-D3 are device dependent. In the D0 state, the device is in a fully-on operating state. The D1 and D2 states are intermediate power states whose definition varies by device. In the D3 state, the device is powered off and is unresponsive.

The ACPI specification defines four central processing unit (CPU) power states, i.e., C0-C3. The C0 state is the CPU operating state. The C1 state is where the CPU is not executing instructions, but can return to an executing state essentially instantaneously. The C2 state is a state where the CPU maintains all software visible state, but may take longer to wake-up. In the C3 state, the CPU does not need to keep its cache coherent, but otherwise maintains CPU state. The ACPI specification defines sixteen performance (P) states that a device or CPU (operating in D0 or C0, respectively) can enter. While the P states are implementation dependent, P0 is always the highest-performance state, with P1 to Pn being successively lower-performance states, up to an implementation-specific limit of n, which is less than or equal to sixteen.

With reference to FIG. 1, a conventional phase locked loop (PLL) 100 is illustrated that provides an application appropriate output clock signal at a frequency that is responsive to a reference clock signal and one or more associated divider values. The reference clock signal is provided to an input of an input divider 102 of the PLL 100. A divider value of the input divider 102 is dictated by a value stored in an input divider register 104. An output of the input divider 102 is coupled to a first input of a phase detector 106, whose output is coupled to an input of a loop filter 108. An output of the loop filter 108 is coupled to an input of a charge pump 110, whose output is coupled to an input of a voltage controlled oscillator (VC0) 112. An output of the VC0 112 is coupled to an input of a feedback divider 114, whose output is coupled to a second input of the phase detector 106. A divider value of the feedback divider 114 is dictated by a value stored in a feedback divider register 116.

With reference to FIG. 2, a conventional processor system 200 is illustrated that includes a single PLL 202, which may be configured in the same manner as the PLL 100 of FIG. 1. The PLL 202 is coupled to a power management state controller 204, which is configured to write values to one or more registers, e.g., input and feedback divider registers, of the PLL 202 to cause the PLL 202 to provide a CPU clock signal to CPU 206 at a desired frequency for a given power state.

Moving to FIG. 3, a conventional processor system 300 is illustrated that employs multiple PLLs. A main PLL 302 receives a reference clock signal and provides an output clock signal (having a desired frequency) to inputs of PLL 304 and PLL 306, respectively. The PLL 304 provides a CPU clock signal to CPU 310 and the PLL 306 provides a clock signal to circuit 312, which may be a CPU or other circuit which requires a clock signal. The PLLs 304 and 306 may provide a clock signal at the same or different frequencies. The PLLs 302, 304 and 306 are coupled to a power management state controller 308, which is configured to write values to registers, e.g., input and feedback divider registers, of the PLLs 302-306 to cause the PLLs 304 and 306 to provide clock signals at one or more desired frequencies corresponding to desired power states. It should be appreciated that when the frequencies of the clock signals provided by the PLLs 302-306 are changed at the same time, latency associated with the frequency change corresponds to a re-locking time of the slowest one of the PLLs 302-306.

What is needed are clock management techniques that generally reduce latency associated with frequency adjustment of a clock signal.

BRIEF DESCRIPTION OF THE DRAWINGS

The present disclosure may be better understood, and its numerous features and advantages made apparent to those skilled in the art by referencing the accompanying drawings.

The use of the same reference symbols in different drawings indicates similar or identical items.

DESCRIPTION OF THE PREFERRED EMBODIMENT(S)

Figure 1:
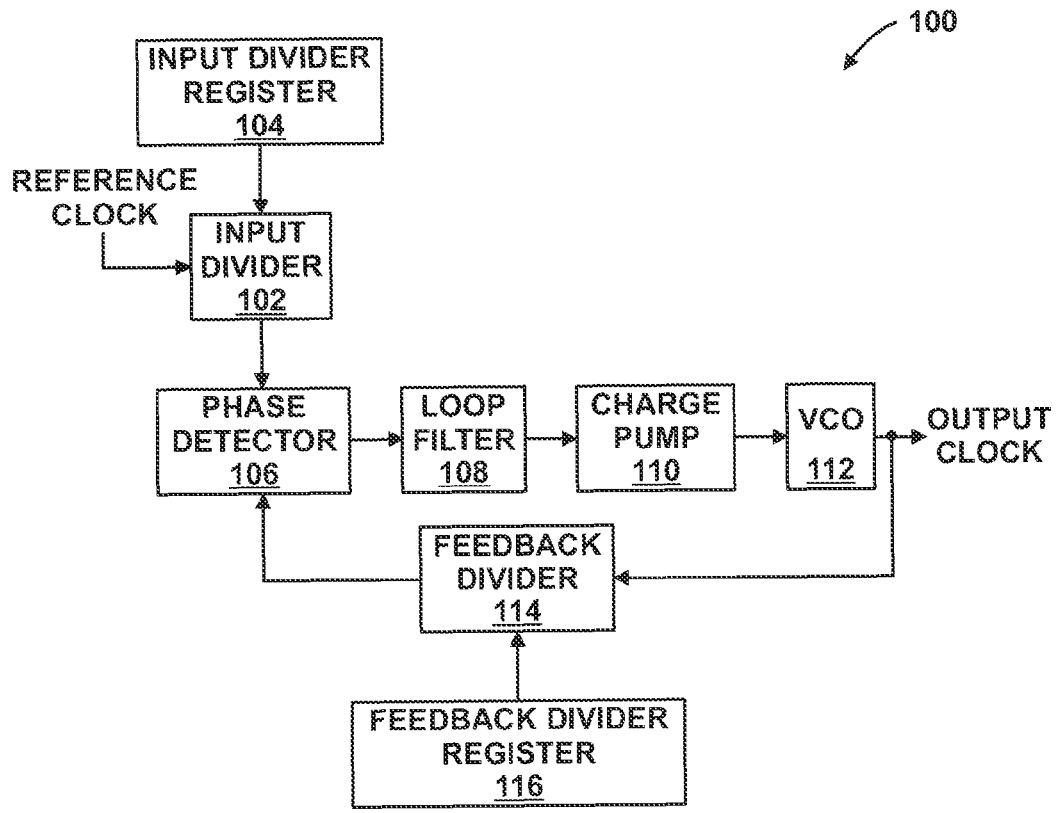
FIG. 1 is an electrical block diagram of a conventional phase locked loop (PLL).
Figure 2:
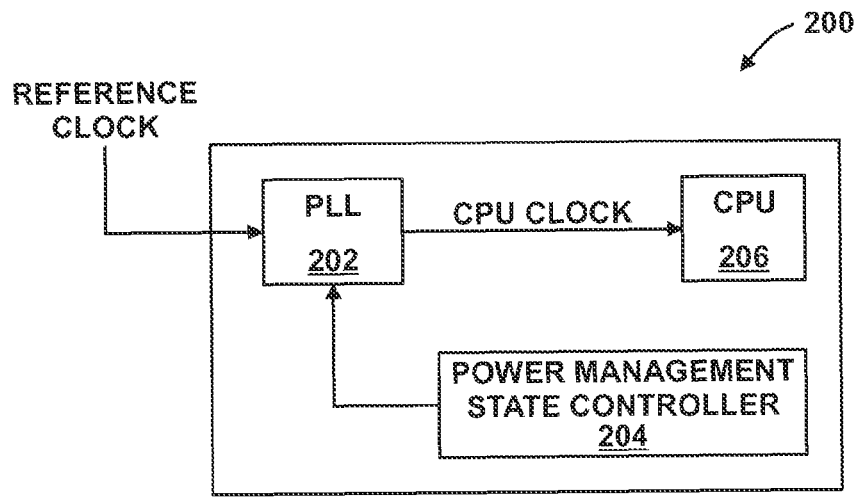
FIG. 2 is an electrical block diagram of a conventional processor system that employs a single PLL.
Figure 3:
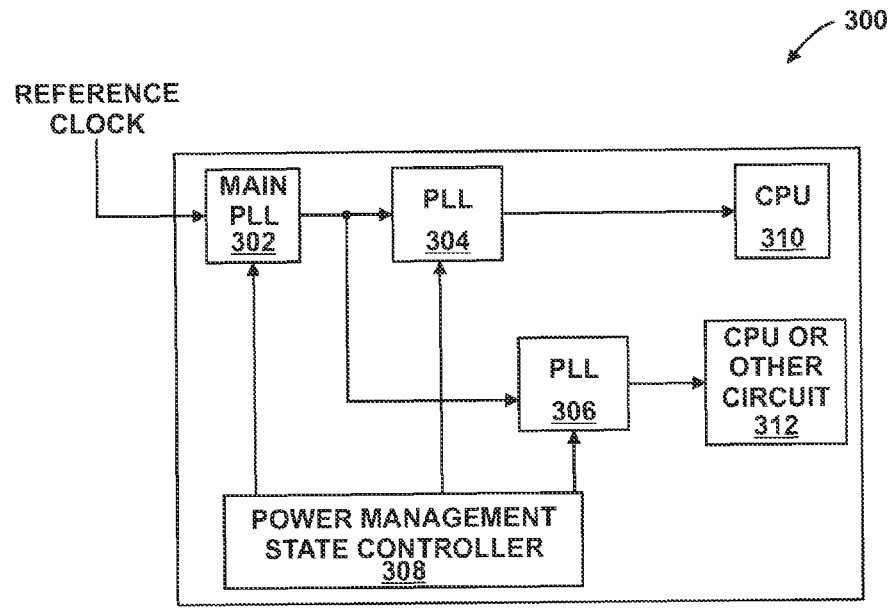
FIG. 3 is an electrical block diagram of a conventional processor system that employs multiple PLLs.

According to various embodiments of the present disclosure, a programmable clock generator is described herein that provides a generated clock signal having a relatively wide frequency range. The clock generator is configured to facilitate a frequency change in the generated clock signal (responsive to a mode signal) without requiring modification of a frequency of a clock signal (e.g., quadrature clock signals) provided by a phase locked loop (PLL) associated with the clock generator. The clock generator technique is particularly advantageous when employed in modern microprocessor systems that employ multiple clock domains, each of which may operate at a different frequency and may frequently change frequency in response to, for example, a power management state change. In this case, multiple clock generators (e.g., one for each clock domain) may be employed to facilitate independent and frequent change in operating frequencies of the clock domains.

According to one aspect of the present disclosure, a pulse removal technique may be employed to provide increased adjustment of an effective frequency of a generated clock signal. According to this embodiment, the effective frequency of the generated clock signal is modified by periodic pulse skipping (i.e., removing one or more clock pulses from each selected time period in a clock stream of the generated clock signal). According to various aspects of the present disclosure, a single PLL may be used to provide quadrature clock signals for a number of clock generators, which do not include internal PLLs. The clock generators may provide respective generated clock signals at different frequencies to associated clocked logic circuits. The associated clocked logic circuits may correspond to one or more CPU cores, a Northbridge circuit, a memory block, etc. When a clock generator is providing a generated clock signal to a static clocked logic circuit, the clock generator may employ periodic pulse skipping, i.e., removing one or more pulses from a clock stream during each predetermined time period of the clock stream. According to various aspects of the present disclosure, a clock generator may be designed to provide generated clock signals with high frequency granularity and frequencies that cannot be readily provided by conventional clock dividers. As used herein, the term "coupled" includes both a direct electrical connection between elements (or blocks) and an indirect electrical connection between elements (or blocks) provided by one or more intervening elements (or blocks). The term "actual frequency," as used herein, means a frequency achieved without employing pulse skipping. As used herein the term "effective frequency" means a frequency achieved with pulse skipping or achieved without employing pulse skipping. In this disclosure, "pulse skipping" means removing one or more pulses from a clock stream within a predetermined time period.

While a conventional flip-flop based counter frequency divider can be used to provide a generated clock signal, a conventional flip-flop based counter frequency divider is not readily configurable to provide arbitrary clock signal waveforms and can usually only toggle on a rising edge of a reference clock signal. As such, generating a clock signal at a frequency with a conventional flip-flop base counter frequency divider has required a reference clock signal having a frequency that is four times the frequency required to generate the same frequency clock signal using a clock generator configured according to the present disclosure. Moreover, conventional flip-flop based counter frequency dividers are not capable of generating a divide by one or a divide by one-half. While a conventional shift register may function as a clock generator to generate arbitrary clock signal waveforms, conventional shift registers have also required a reference clock signal having a frequency that is four times the generated clock signal frequency required to generate the same frequency clock signal using a clock generator configured according to the present disclosure. In high frequency applications, generating a reference clock signal at a frequency that is four times a generated clock signal may consume a relatively large amount of power and may be impractical.

According to one aspect of the present disclosure, a clock generator system includes a phase locked loop (PLL), a first clock generator, and a second clock generator. The PLL includes a first output configured to provide a first clock signal at a first frequency and a second output configured to provide a second clock signal at the first frequency. The second clock signal is out-of-phase with the first clock signal. The first clock generator includes a first clock input configured to receive the first clock signal, a second clock input configured to receive the second clock signal, a mode signal input configured to receive a first mode signal, and an output. The output of the first clock generator is configured to provide a first generated clock signal whose effective frequency is based on both the first and second clock signals and the first mode signal. The second clock generator includes a first clock input configured to receive the first clock signal, a second clock input configured to receive the second clock signal, a mode signal input configured to receive a second mode signal, and an output. The output of the second clock generator is configured to provide a second generated clock signal whose effective frequency is based on both the first and second clock signals and the second mode signal.

According to another embodiment of the present disclosure, an integrated circuit includes a phase locked loop (PLL), a first clock generator, a second clock generator, a static clocked logic circuit, and a dynamic clocked logic circuit. The PLL includes a first output configured to provide a first clock signal at a first frequency and a second output configured to provide a second clock signal at the first frequency. The second clock signal is out-of-phase with the first clock signal. The first clock generator includes a first clock input configured to receive the first clock signal, a second clock input configured to receive the second clock signal, a mode signal input configured to receive a first mode signal, and an output. The output of the first clock generator is configured to provide a first generated clock signal whose effective frequency is based on the first and second clock signals and the first mode signal. The second clock generator includes a first clock input configured to receive the first clock signal, a second clock input configured to receive the second clock signal, a mode signal input configured to receive a second mode signal, and an output. The output of the second clock generator is configured to provide a second generated clock signal whose actual frequency is based on the first and second clock signals and the second mode signal. The static clocked logic circuit includes a clock input configured to receive the first generated clock signal. The dynamic clocked logic circuit includes a clock input configured to receive the second generated clock signal.

According to another aspect of the present disclosure, a method of providing clock signals includes generating first and second clock signals that are substantially in quadrature with each other. First and second mode signals are received that correspond to first and second generated clock signals, respectively. The first generated clock signal is provided at a first effective frequency based on the first and second clock signals and the first mode signal. The second generated clock signal is provided at a second effective frequency based on the first and second clock signals and the second mode signal.

Figure 4:
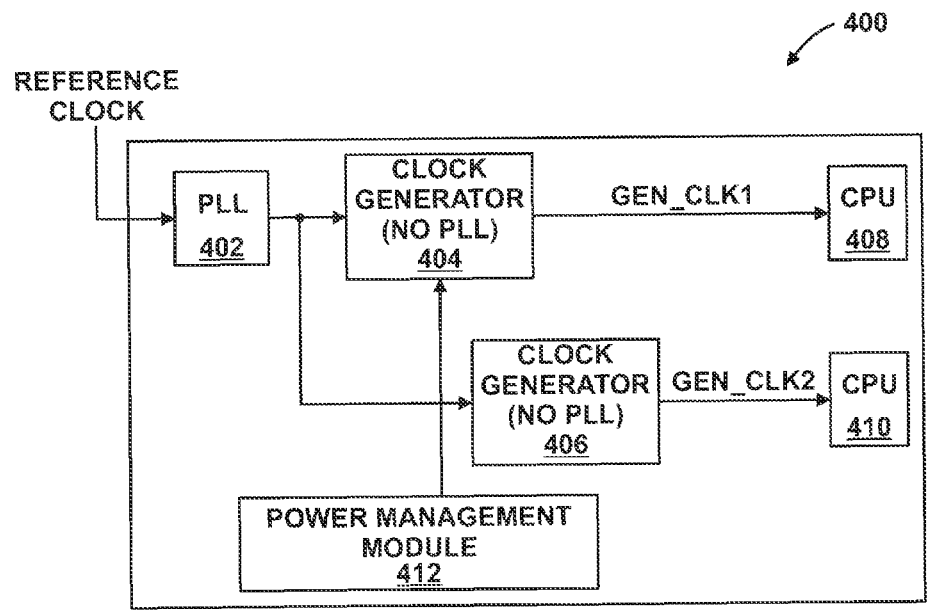
FIG. 4 is an electrical block diagram of a processor system that employs a single PLL in conjunction with multiple clock generators configured according to various embodiments of the present disclosure.

With reference to FIG. 4, an example processor system 400 is illustrated that includes two clock generators 404 and 406 that are configured according to various aspects of the present disclosure. The clock generators 404 and 406 receive quadrature clock signals from a phase locked loop (PLL) 402 that receives a reference clock signal from, for example, a crystal oscillator. The clock generators 404 and 406 are configured to generate clock signals that can rise (or fall) responsive to each clock edge of the quadrature clock signals. As is described in further detail below, the clock generators 404 and 406 facilitate modification of a frequency of clock signals provided from the generators 404 and 406 without changing input and feedback dividers of the PLL 402. In this manner, latency associated with re-locking the PLL 402 at frequency change is essentially avoided. Moreover, frequencies of the clock signals provided by the generators 404 and 406 may be independently changed in a relatively efficient manner. In at least one embodiment, when a frequency of a clock signal is changed the frequency is changed incrementally to reduce inductive noise that may be generated. While only two clock generators are shown in FIG. 4, it should be appreciated that any number of clock generators, e.g., one for each clock domain, may be employed in a system configured according to one or more of the disclosed embodiments.

As is illustrated, the generator 404 provides a generated clock signal (GEN_CLK1) to CPU 408. Similarly, the generator 406 provides a generated clock signal (GEN_CLK2) to CPU 410. The generators 404 and 406 are coupled to a power management module (e.g., a power management state controller) 412, which provides information to a sequential logic circuit (not shown in FIG. 4) that the sequential logic circuit (e.g., a clock state machine) utilizes to provide respective patterns (of enable or mode bits) to the generators 404 and 406, which the generators 404 and 406 use to generate the respective generated clock signals at desired frequencies. It should be appreciated that the frequencies of the generated clock signals may be changed, according to the various techniques disclosed herein, in response to events other than power management events. It should also be appreciated that while the discussion herein focuses on using quadrature clock signals in conjunction with the generators 404 and 406 the techniques described herein may be broadly extended to clock generators that use multiple clock signals that have an established phase relationship to provide generated clock signals having desired frequencies. For example, four clock signals with a progressive forty-five degree phase relationship (i.e., a first clock signal at zero degrees, a second clock signal at forty-five degrees, a third clock signal at ninety degrees, and a fourth clock signal at one-hundred thirty-five degrees) may be used to provide eight clock edges each clock cycle.

Figure 5:
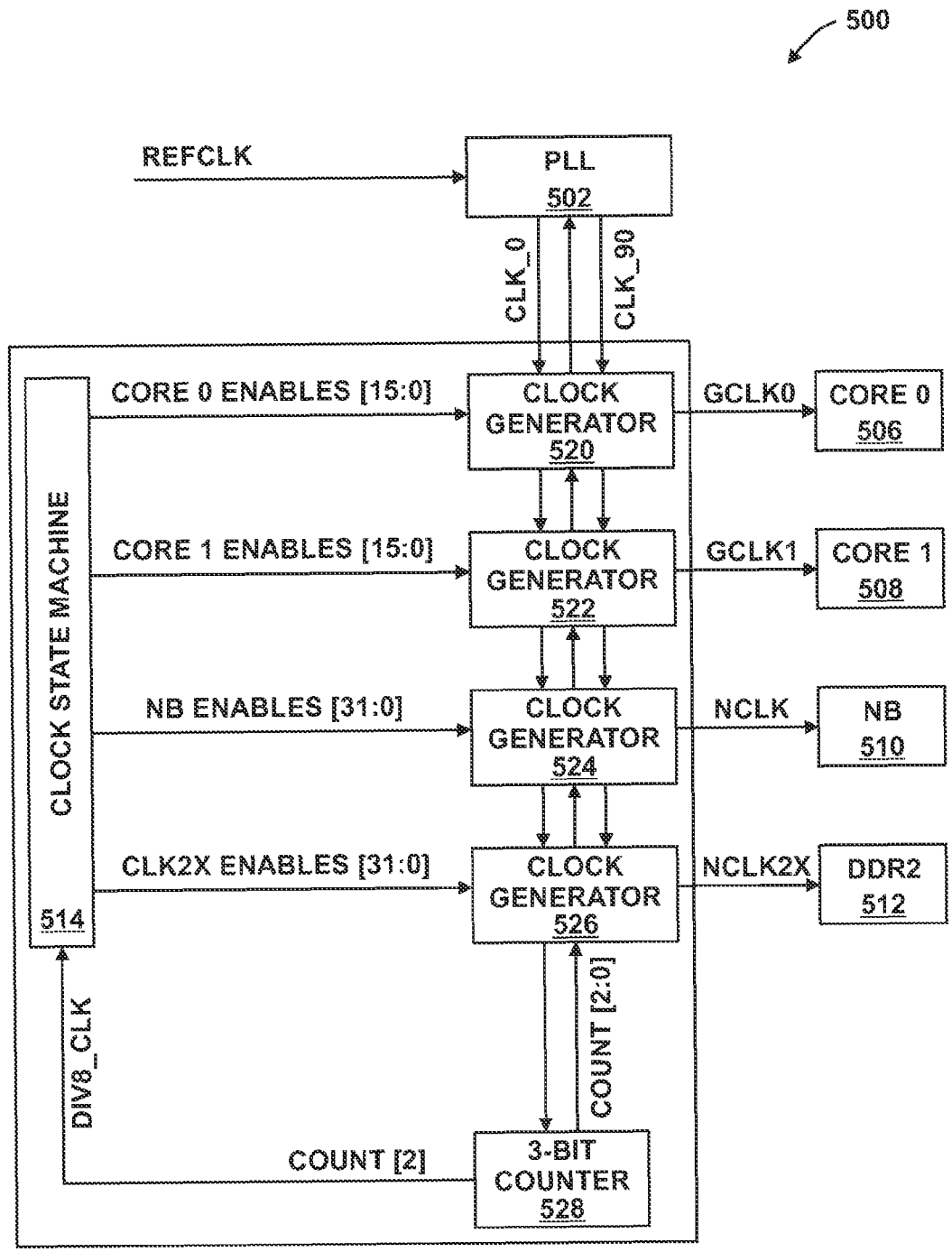
FIG. 5 is an electrical block diagram of a processor system that employs a clock generator system that includes a clock state machine and multiple clock generators configured according to various aspects of the present disclosure.

Moving to FIG. 5, a processor system 500 is illustrated that employs a clock generator system that uses a single PLL 502 to provide generated clock signals (GCLK0, GCLK1, NCLK, and NCLK2X) to multiple processor subsystems 506, 508, 510, and 512. In FIG. 5, the processors subsystems 506, 508, 510, and 512 correspond to a first processor core (core 0), a second processor core (core 1), a Northbridge (NB), and a memory module (DDR2), respectively. It should be appreciated that the techniques disclosed herein may be readily extended to processor systems that included more or less than two cores. The processor system 500 includes a clock state machine 514 and multiple clock generators 520, 522, 524, and 526, which are each configured according to various embodiments of the present disclosure to provide the generated clock signals (GCLK0, GCLK1, NCLK, and NCLK2X) at the same or different frequencies. Responsive to input received from a power management module (which may be implemented in the Northbridge) or other subsystem, the clock state machine 514 provides an appropriate pattern to each of the clock generators 520-526. In a typical implementation, the clock state machine 514 includes a separate state machine (to respectively generate an appropriate pattern) for each of the clock generators 520-526. To reduce overhead associated with providing patterns to the clock generators 520 and 522, two enable bits per quadrature clock cycle my be employed. In this case, each of the two bits is provided to two inputs of each of the clock generators 520 and 522. It should be appreciated that only providing two enable bits per quadrature clock cycle reduces the resolution of the frequencies of the generated clock signals that may be provided.

Figure 6:
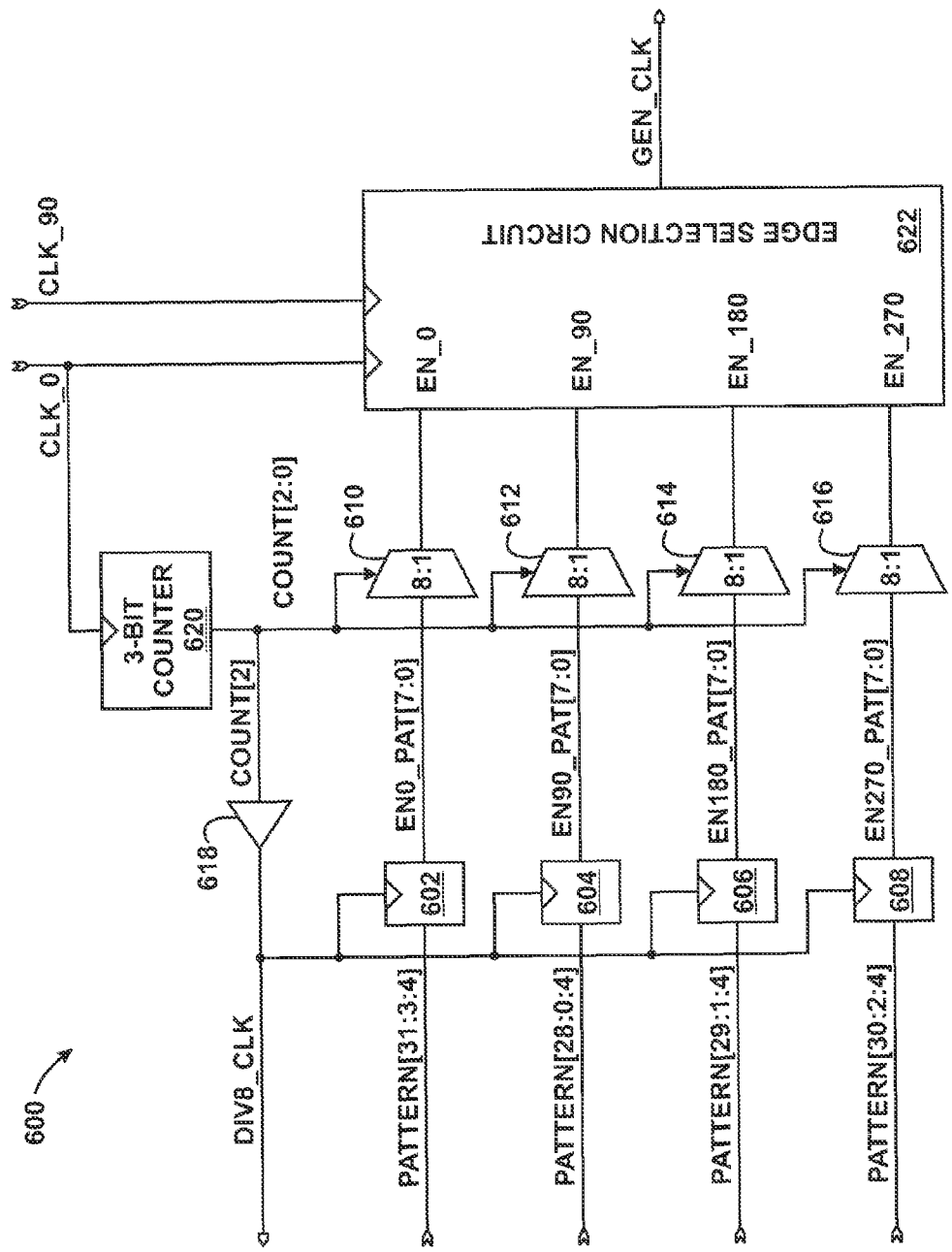
FIG. 6 is an electrical block diagram of an example clock generator configured according to an embodiment of the present disclosure.
Figure 7:
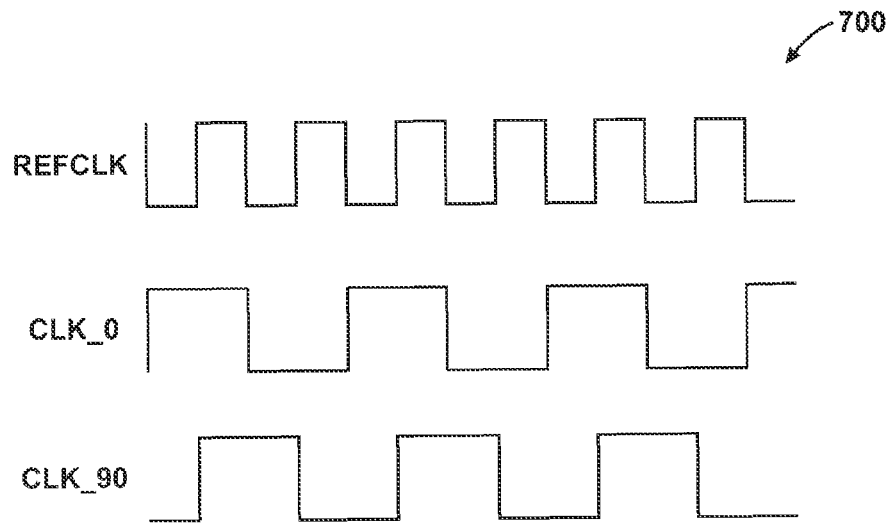
FIG. 7 is a signal diagram of example quadrature clock signals (CLK_0 and CLK_90) that are generated from a reference clock signal (REFCLK) and provided to respective clock inputs of the clock generator of FIG. 6.

Moving to FIG. 6, a clock generator 600 is depicted that includes eight flip-flops 602, eight flip-flops 604, eight flip-flops 606, and eight flip-flops 608. The flip-flops 602-608 may be, for example, edge-triggered D flip-flops or flow-through latches. In the clock generator 600 of FIG. 6, new patterns are provided to data inputs of the flip-flops 602-608 every eight processor cycles of the clock signal CLK_0. Providing new patterns (e.g., two or four bit patterns) every eight quadrature clock cycles reduces a required complexity of a state machine (or other logic circuit) that generates the patterns, which correspond to a desired frequency for a clocked device. It should be appreciated that, depending on the application, a state machine may be designed to produce new patterns each quadrature clock cycle, if desired. Respective outputs of the flip-flops 602 are provided to respective data inputs of a multiplexer 610, whose output is coupled to a first data input (EN_0) of edge selection circuit 622. Similarly, respective outputs of the flip-flops 604 are provided to respective data inputs of multiplexer 612, whose output is coupled to a second data input (EN_90) of the edge selection circuit 622. In a similar manner, respective outputs of the flip-flops 606 are provided to respective data inputs of multiplexer 614, whose output is coupled to a third data input (EN_180) of the edge selection circuit 622. Likewise, respective outputs of the flip-flops 608 are provided to respective data inputs of multiplexer 616, whose output is coupled to a fourth data input (EN_270) of the edge selection circuit 622.

Figure 10:
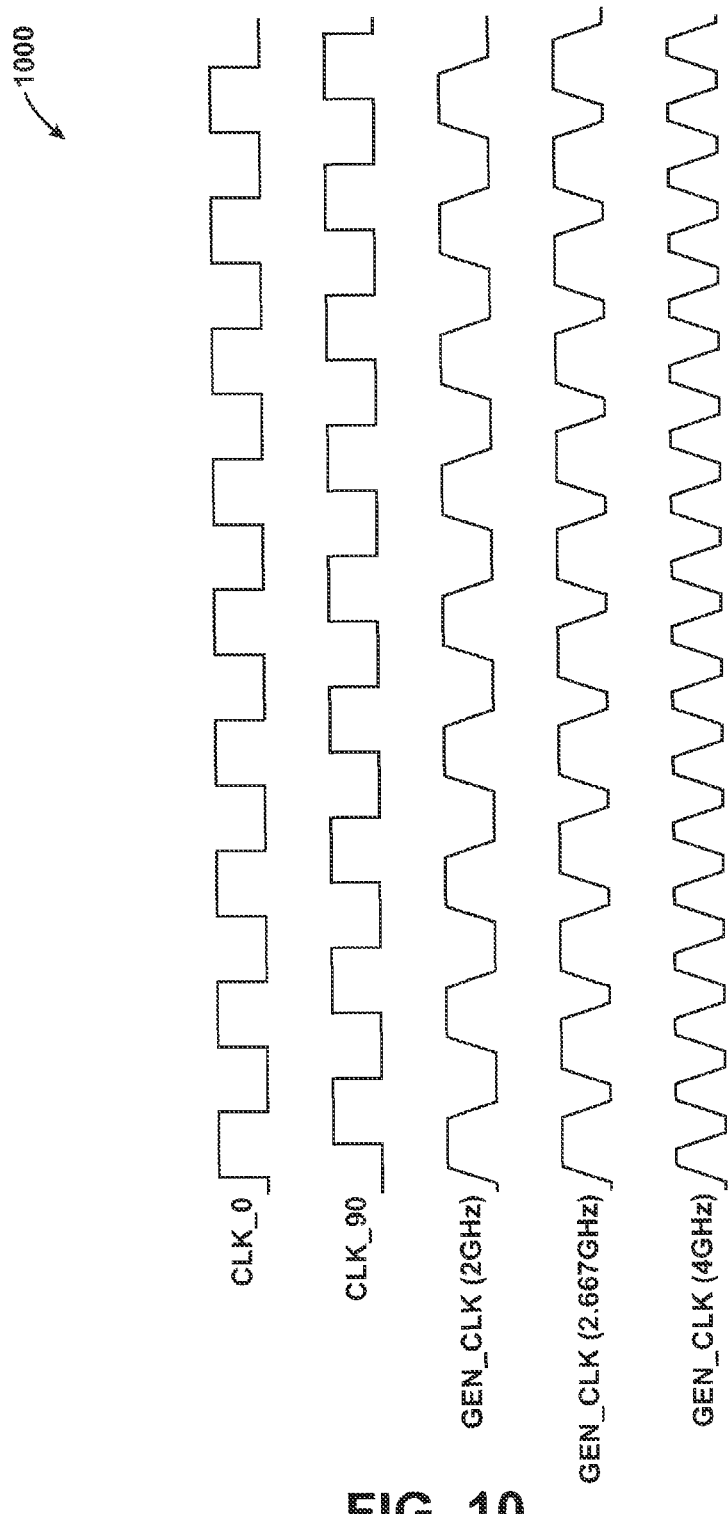
FIG. 10 is an example signal diagram of quadrature clock signals (CLK_0 and CLK_90) that are provided to clock inputs of the clock generator of FIG. 6 and three example generated clock signals (GEN_CLK) provided at an output of the clock generator of FIG. 6.

The edge selection circuit 622, based on the quadrature clock signals (CLK_0 and CLK_90) alternately selects a mode (enable) bit at the first, second, third, and fourth inputs to set a frequency of a generated clock signal (GEN_CLK). For example, assuming that the quadrature clock signals are set at a frequency of 2.0 GHz and a pattern of '1010' is applied to the first, second, third, and fourth inputs, respectively, of the edge selection circuit 622 each quadrature clock cycle, a 4.0 GHz generated clock signal (GEN_CLK) is provided at the output of the edge selection circuit 622 (see FIG. 10). As another example, assuming that the quadrature clock signals are set at a frequency of 2.0 GHz and a pattern of '1100' is applied to the first, second, third, and fourth inputs, respectively, of the edge selection circuit 622 each quadrature clock cycle, a 2.0 GHz generated clock signal (GEN_CLK) is provided at the output of the edge selection circuit 622 (see FIG. 10). As yet another example, assuming that the quadrature clock signals are set at a frequency of 2.0 GHz and a pattern of '1101' is applied to the first, second, third, and fourth inputs, respectively, of the edge selection circuit 622 for a first quadrature clock cycle, a pattern of "1011" is applied to the first, second, third, and fourth inputs, respectively, of the edge selection circuit 622 for a second quadrature clock cycle, and a pattern of "0110" is applied to the first, second, third, and fourth inputs, respectively, of the edge selection circuit 622 for a third quadrature clock cycle, a 2.667 GHz generated clock signal (GEN_CLK) is provided at the output of the edge selection circuit 622 (see FIG. 10). Example patterns for divider values of 0.5, 0.75, 1, 1.25, 1.5, 1.75, 2, and 2.25 are set forth below in TABLE 1 for quadrature clock signals having a frequency of 2.0 GHz.

TABLE 1

| | Divider | | | | | | | |
|---|---|---|---|---|---|---|---|---|
| | 0.5 | 0.75 | 1 | 1.25 | 1.5 | 1.75 | 2 | 2.25 |
| Output Frequency (Mhz) | 4000 | 2667 | 2000 | 1600 | 1333 | 1143 | 1000 | 889 |
| Pattern length (bits) | 2 | 3 | 4 | 5 | 6 | 7 | 8 | 9 |
| Clock Waveform | 10 | 110 | 1100 | 11100 | 111000 | 1111000 | 11110000 | 111110000 |
| # Cycles to repeat | 1 | 3 | 1 | 5 | 3 | 7 | 2 | 9 |
| Cycle 0 Inputs | 1010 | 1101 | 1100 | 1110 | 1110 | 1111 | 1111 | 1111 |
| Cycle 1 Inputs | Repeat | 1011 | Repeat | 0111 | 0011 | 0001 | 0000 | 1000 |
| Cycle 2 Inputs | | 0110 | | 0011 | 1000 | 1110 | Repeat | 0111 |
| Cycle 3 Inputs | | Repeat | | 1001 | Repeat | 0011 | | 1100 |
| Cycle 4 Inputs | | | | 1100 | | 1100 | | 0011 |
| Cycle 5 Inputs | | | | Repeat | | 0111 | | 1110 |
| Cycle 6 Inputs | | | | | | 1000 | | 0001 |
| Cycle 7 Inputs | | | | | | Repeat | | 1111 |
| Cycle 8 Inputs | | | | | | | | 0000 |
| Cycle 9 Inputs | | | | | | | | Repeat |

Example patterns for divider values of 2.5, 2.75, 3, and 3.25 are set forth below in TABLE 2 for quadrature clock signals having a frequency of 2.0 GHz.

TABLE 2

| | Divider | | | |
|---|---|---|---|---|
| | 2.5 | 2.75 | 3 | 3.25 |
| Output Frequency (Mhz) | 800 | 727 | 667 | 615 |
| Pattern length (bits) | 10 | 11 | 12 | 13 |
| Clock Waveform | 1111100000 | 11111100000 | 111111000000 | 1111111000000 |
| # Cycles to repeat | 5 | 11 | 3 | 13 |
| Cycle 0 Inputs | 1111 | 1111 | 1111 | 1111 |
| Cycle 1 Inputs | 1000 | 1100 | 1100 | 1110 |
| Cycle 2 Inputs | 0011 | 0001 | 0000 | 0000 |
| Cycle 3 Inputs | 1110 | 1111 | Repeat | 0111 |
| Cycle 4 Inputs | 0000 | 1000 | | 1111 |
| Cycle 5 Inputs | Repeat | 0011 | | 0000 |
| Cycle 6 Inputs | | 1111 | | 0011 |
| Cycle 7 Inputs | | 0000 | | 1111 |
| Cycle 8 Inputs | | 0111 | | 1000 |
| Cycle 9 Inputs | | 1110 | | 0001 |
| Cycle 10 Inputs | | 0000 | | 1111 |
| Cycle 11 Inputs | | Repeat | | 1100 |
| Cycle 12 Inputs | | | | 0000 |
| Cycle 13 Inputs | | | | Repeat |

Example patterns for divider values of 3.5, 3.75 and 4 are set forth below in TABLE 3 for quadrature clock signals having a frequency of 2.0 GHz.

TABLE 3

| | Divider | | |
|---|---|---|---|
| | 3.5 | 3.75 | 4 |
| Output Frequency (Mhz) | 571 | 533 | 500 |
| Pattern length (bits) | 14 | 15 | 16 |
| Clock Waveform | 11111110000000 | 111111110000000 | 1111111100000000 |
| # Cycles to repeat | 7 | 15 | 4 |
| Cycle 0 Inputs | 1111 | 1111 | 1111 |
| Cycle 1 Inputs | 1110 | 1111 | 1111 |
| Cycle 2 Inputs | 0000 | 0000 | 0000 |
| Cycle 3 Inputs | 0011 | 0001 | 0000 |
| Cycle 4 Inputs | 1111 | 1111 | Repeat |
| Cycle 5 Inputs | 1000 | 1110 | |
| Cycle 6 Inputs | 0000 | 0000 | |
| Cycle 7 Inputs | Repeat | 0011 | |
| Cycle 8 Inputs | | 1111 | |
| Cycle 9 Inputs | | 1100 | |
| Cycle 10 Inputs | | 0000 | |
| Cycle 11 Inputs | | 0111 | |
| Cycle 12 Inputs | | 1111 | |
| Cycle 13 Inputs | | 1000 | |
| Cycle 14 Inputs | | 0000 | |
| Cycle 15 Inputs | | Repeat | |

In TABLES 1-3, the pattern length is the length of the repeating clock waveform measured in quadrature clock phases. For example, to generate a 2 GHz clock signal a pattern with a length of four and a value of "1100" is provided in each quadrature clock cycle. As another example, to generate a 1.333 GHz clock signal a pattern with a length of six and a value of "111000" is repeated two times over three quadrature clock cycles.

Figure 8:
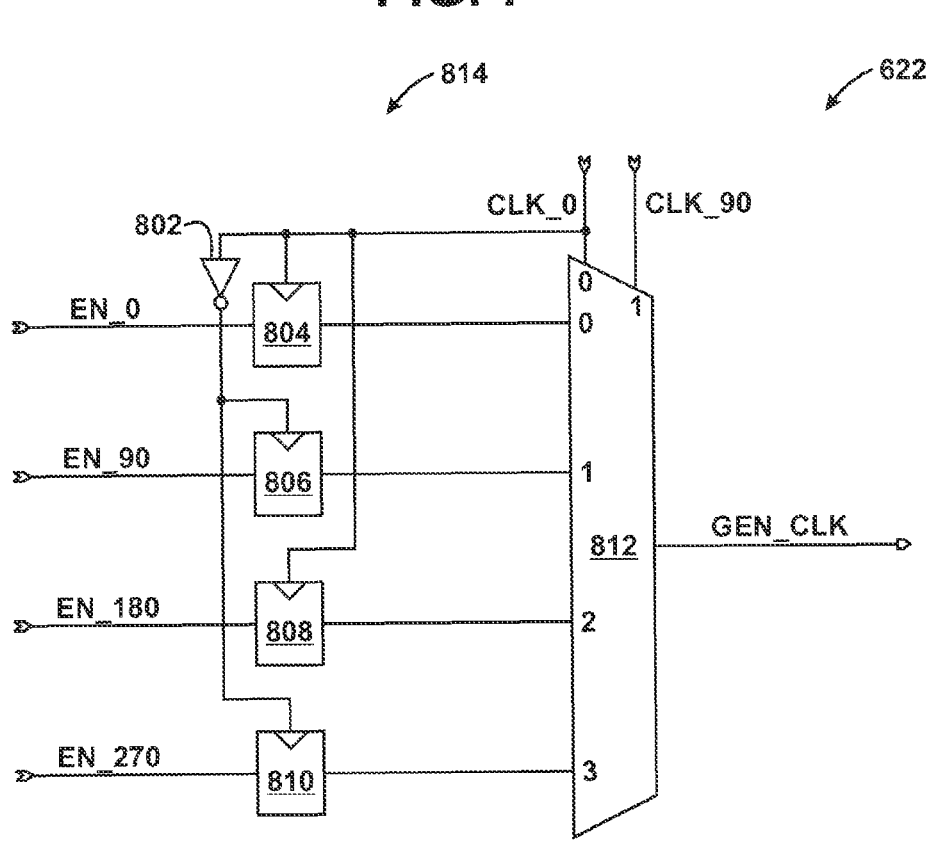
FIG. 8 is an electrical block diagram of an example clock generator (edge selection circuit) that utilizes the quadrature clock signals (CLK_0 and CLK_90) illustrated in FIG. 7.
Figure 9:
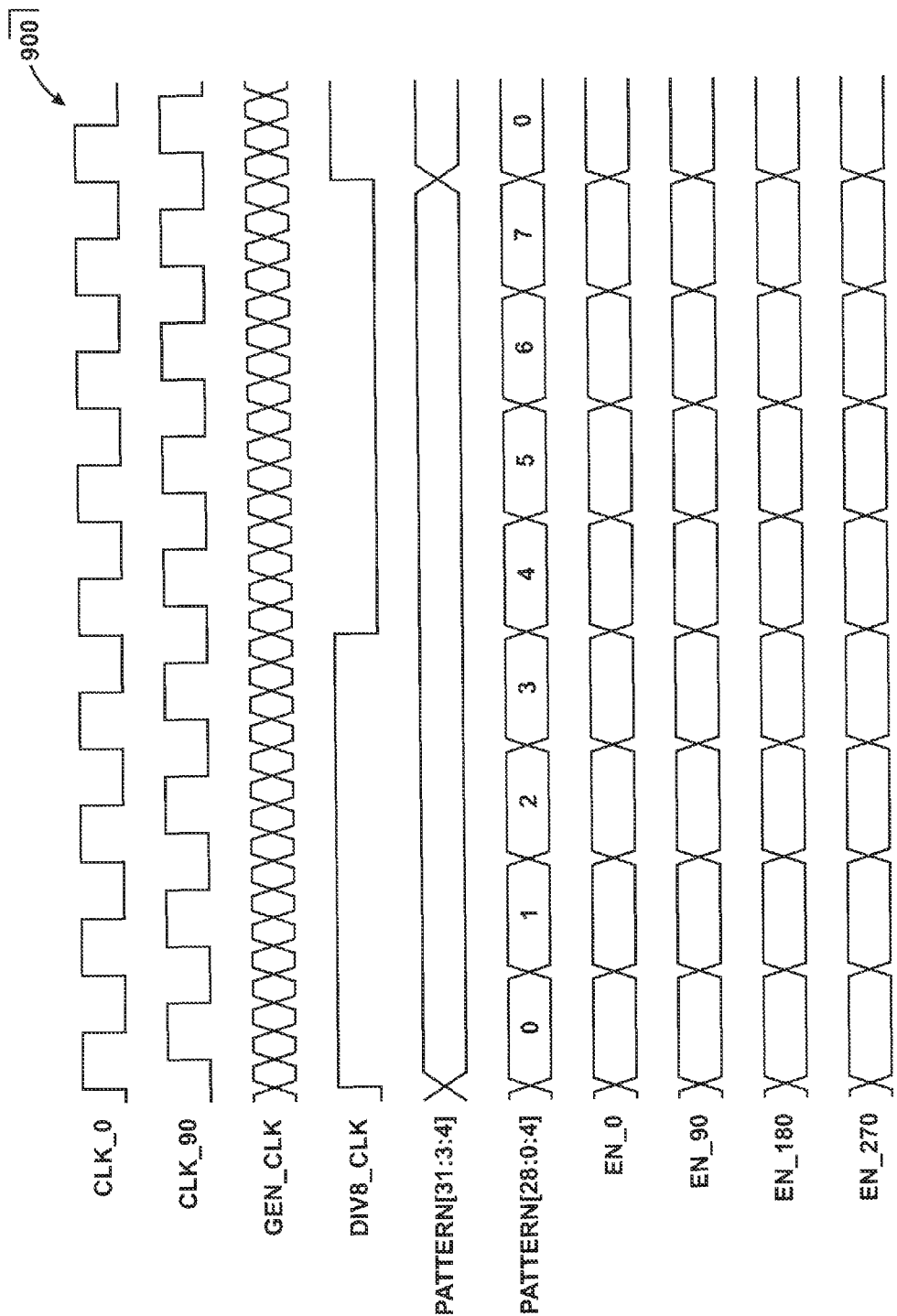
FIG. 9 is an example signal diagram of various signals associated with the clock generator of FIG. 6.

Turning to FIG. 8, the edge selection circuit 622 (clock generator) is illustrated in further detail. The circuit 622 includes a flip-flop 804, a flip-flop 806, a flip-flop 808, and a flip-flop 810. The flip-flops 804-810 may be, for example, edge-triggered D flip-flops or flow-through latches. Patterns may be provided to respective data inputs of the flip-flops 804-810, via the flip-flops 602-608 of FIG. 6. Alternatively, patterns may be directly provided to the data inputs of the flip-flops 804-810. Clock inputs of the flip-flops 804 and 806 receive an inverted CLK_O signal, provided by inverter 802. An output of the flip-flop 804 is coupled to a first data input (0) of multiplexer 812 and an output of the flip-flop 806 is coupled to a second data input (1) of multiplexer 812. Similarly, an output of the flip-flop 808 is coupled to a third data input (2) of multiplexer 812 and an output of the flip-flop 810 is coupled to a fourth data input (3) of multiplexer 812. The multiplexer 812, based on edges of the quadrature clock signals (CLK_0 and CLK_90), alternately selects an enable bit at the first, second, third, and fourth inputs, respectively, of the multiplexer 812 to set a frequency of a generated clock signal (GEN_CLK).

The edge selection circuit 622 reads four bits in parallel each quadrature clock cycle (includes four clock edges) and serially reads them out as the generated clock signal (GEN_CLK). The data inputs of the flip-flops 804-810 form a 4-bit pattern register. The outputs of the flip-flops 804-810 feed the data inputs of the 4:1 multiplexer 812. The quadrature clock signals (CLK_0 and CLK_90) feed respective select inputs of the multiplexer 812, which selects the proper pattern bit for each quadrature clock cycle. As the output of each flip-flop 804-810 is setup to a respective one of the data inputs of the multiplexer 812 before the data inputs are selected, the clock-to-output delay of the circuit 622 is substantially insensitive to the delay of the flip-flops 802-810 and is substantially dependent on the select-to-output delay of the multiplexer 812. When the pattern registers are supplied by a clock domain running at one-eighth the frequency of the quadrature clock signals, logic that generates the pattern register bits may be simplified. In one embodiment, external logic (e.g., a state machine) supplies the pattern register bits thirty-two bits at a time, four bits for each of the eight quadrature clock cycles. A 3-bit counter 620 (see FIG. 6), which generates a divide-by-eight clock (DIV8_CLK), is used to select which four pattern bits are consumed each quadrature clock cycle.

According to another aspect of the present disclosure a pulse removal technique may be employed to adjust a frequency of a generated clock signal. Removing pulses from a clock stream provides a generated clock signal having an effective frequency that may be used to clock static clocked logic circuits, such as CPUs. According to one aspect of the pulse removal technique, a divider identification (DID) and a frequency ID (FID) may be employed to identify how a clock signal is to be modified for each P and C power management state, for example. Typically, a DID corresponds to a power of two division and an FID indicates how many pulses out of a maximum number of pulses are to remain in each pulse train. In this embodiment, the effective frequency is given by:

$$f_e = (f_q/DID)*(FID/P_{max})$$

where $f_e$ is the effective frequency, $f_q$ is the quadrature clock frequency, and $P_{max}$ is the maximum number of pulses for the quadrature clock frequency. For example, if the quadrature clock frequency is 2.2 GHz, the maximum number of pulses is set to twenty-two. An effective frequency of 600 MHz may be achieved by setting DID equal to two and FID equal to twelve ($f_e=(2.2 \text{ GHz}/2)*(12/22)=600$ MHz).

Example effective frequencies for different FID and DID values for a quadrature clock frequency of 2.0 GHz are set forth in TABLE 4 below.

TABLE 4

| FID | DID | | | | | | |
|---|---|---|---|---|---|---|---|
| | 1 | 2 | 4 | 8 | 16 | 128 | 512 |
| 11 | 1100 | 550 | 275 | 137.5 | 125 | 15.625 | 3.90625 |
| 12 | 1200 | 600 | 300 | 150 | 125 | 15.625 | 3.90625 |
| 13 | 1300 | 650 | 325 | 162.5 | 125 | 15.625 | 3.90625 |
| 14 | 1400 | 700 | 350 | 175 | 125 | 15.625 | 3.90625 |
| 15 | 1500 | 750 | 375 | 187.5 | 125 | 15.625 | 3.90625 |
| 16 | 1600 | 800 | 400 | 200 | 125 | 15.625 | 3.90625 |
| 17 | 1700 | 850 | 425 | 212.5 | 125 | 15.625 | 3.90625 |
| 18 | 1800 | 900 | 450 | 225 | 125 | 15.625 | 3.90625 |
| 19 | 1900 | 950 | 475 | 237.5 | 125 | 15.625 | 3.90625 |
| 20 | 2000 | 1000 | 500 | 250 | 125 | 15.625 | 3.90625 |

For TABLE 4, the maximum number of pulses is set to twenty. To provide a 1.5 GHz generated clock signal from the 2.0 GHz quadrature clock signal, the DID may be set to one and the FID may be set to fifteen (1.5 GHz=(2.0 GHz/1)*(15/20)), which corresponds to skipping five pulses out of every twenty pulses of a 2.0 GHz quadrature clock signal. With reference to TABLE 1, a 2.0 GHz clock signal may be generated using a pattern of "1100" (see FIG. 10) for each quadrature clock cycle (i.e., each four clock edges). To generate a 1.5 GHz clock signal out of twenty quadrature clock cycles, five of the twenty pulses may be removed using the following patterns for consecutive quadrature clock cycles as follows: "1100" for the first cycle; "1100" for the second cycle; "1100" for the third cycle; "0000" for the fourth cycle; "1100" for the fifth cycle; "1100" for the sixth cycle; "1100" for the seventh cycle; "0000" for the eighth cycle; "1100" for the ninth cycle; "1100" for the tenth cycle; "1100" for the eleventh cycle; "0000" for the twelfth cycle; "1100" for the thirteenth cycle; "1100" for the fourteenth cycle; "1100" for the fifteenth cycle; "0000" for the sixteenth cycle; "1100" for the seventeenth cycle; "1100" for the eighteenth cycle; "1100" for the nineteenth cycle; and "0000" for the twentieth cycle. It should be noted that the patterns in the fourth, eighth, twelfth, sixteenth, and twentieth cycles cause the pulses in those cycles to be removed from the clock stream. It should be appreciated the same effective frequency may be achieved by removing pulses from different cycles, other than the indicated cycles. The patterns may be generated by, for example, a state machine.

Figure 11:
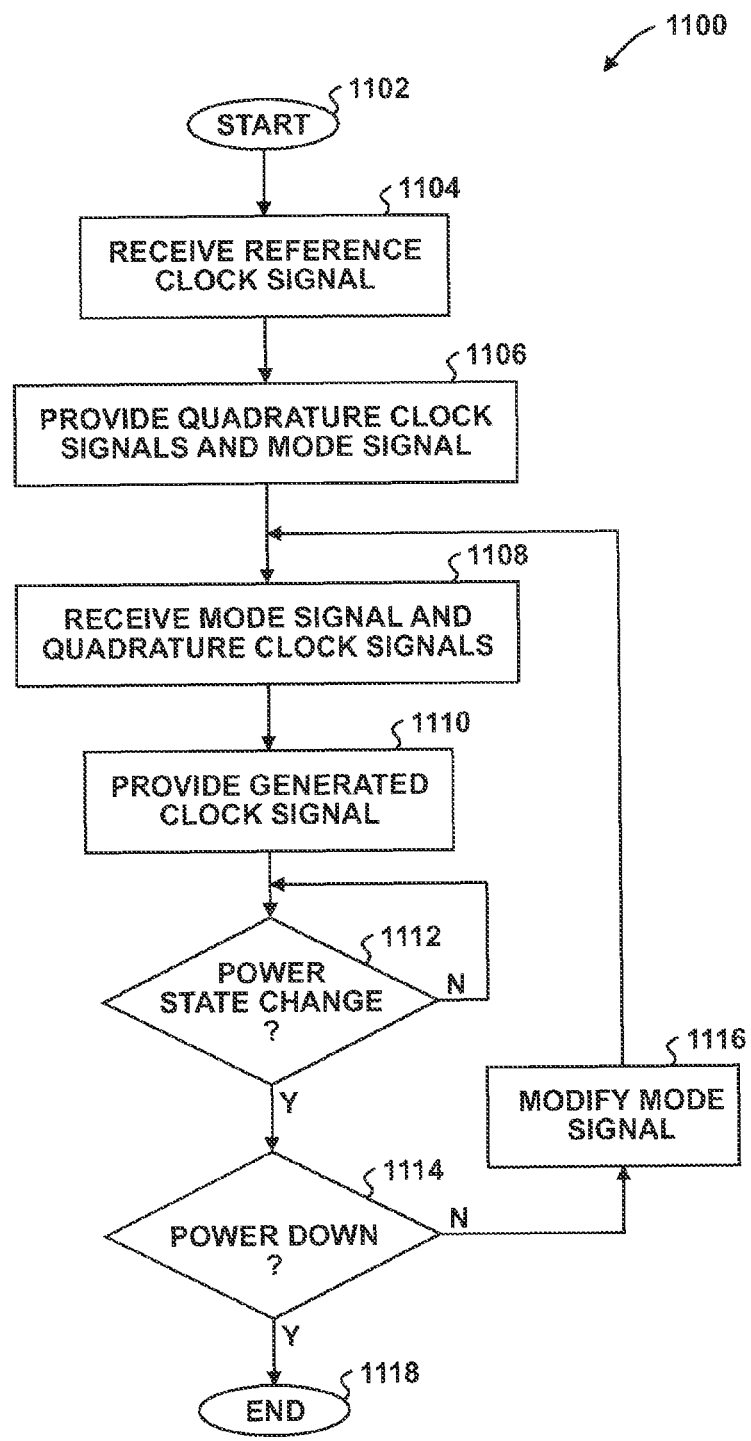
FIG. 11 is a flow chart of an example process for providing a generated clock signal responsive to quadrature clock signals and a mode signal.

With reference to FIG. 11, a process 1100 for providing a generated clock signal is depicted. In block 1102, the process 1100 is initiated at, for example, power-up of the processing system 400. Next, in block 1104, a reference clock signal is received by the PLL 402 of the processing system 400. Then, in block 1106, in response to the reference clock signal, the PLL 402 provides quadrature clock signals to one or more clock generators 404 and 406 of the processing system 400. Also, in block 1106, respective clock state machines (not shown in FIG. 4) provide appropriate respective mode signals (enable or mode bits) for the clock generators 404 and 406 based on respective frequencies selected for each of the clock generators 404 and 406. Then, in block 1108, the clock generators 404 and 406 receive the respective mode signals and the quadrature clock signals.

Next, in block 1110, the clock generators 404 and 406 provide respective generated clock signals to respective clocked logic circuits (in this case CPUs 408 and 410), which in this case are static clocked logic circuits. Then, in decision block 1112, the respective clock state machines determine whether the power management module 412 has indicated that a power state changed is desired. If a power state change is not indicated in block 1112, control loops on block 1112. When a power state change is indicated in block 1112, control transfers to decision block 1114, where the state machines determine whether the processor system 400 is to be powered down. If power down is indicated in block 1114, control transfers to block 1118 where the process 1100 ends. Otherwise, when power down is not indicated in block 1114, control transfers to block 1116, where the state machines modify the respective mode signals based on information provided by the power management module 412.

In a processing system, it is common for different subsystems to operate at different frequencies. For example, a double data rate (DDR) memory module may be designed to operate at several set frequencies, e.g., multiples of 100 MHz. In a typical processing system, achieving the different frequencies from a PLL associated with a CPU core usually requires an integer (e.g., 1, 2, 3, etc.) divider or an integer plus one-half (e.g., 1.5, 2.5, etc.) divider. In this case, as the DDR frequency depends on a maximum CPU core frequency, the DDR frequency may not be an ideal frequency, but the nominal difference is usually less than or equal to ten percent from the ideal frequency and is satisfactory for most applications.

For example, assuming that a PLL is providing quadrature clock signals at 2.3 GHz and a CPU is initially operating at 2.3 GHz (i.e., DID is set equal to one and an FID is set equal to twenty-three) and a power management state change indicates that a 700 MHZ frequency is desired for the CPU. In this case, a clock generator associated with the CPU receives a pattern (from an associated state machine) corresponding to a DID of two and an FID of fourteen. Similarly, a default Northbridge clock signal having a 200 MHz frequency can be derived from the 2.3 GHz clock signal by providing a pattern to an associated clock generator that corresponds to a divide by 11.5. Moreover, a 383 MHz clock signal may be derived from the 2.3 GHz clock signal for a memory module (e.g., a DDR2-800 memory module) by providing a pattern that causes an associated clock or to implement a divide by 6. While the clock signal is not an ideal 400 MHz clock signal, as noted above, the clock signal is within ten percent of the desired value.

TABLE 5 set forth below illustrates a number of exemplary frequencies that may be derived from a number of different quadrature clock signal frequencies (800 to 3200 MHz) using the techniques disclosed herein.

In TABLE 5, the target DDR frequency is 400 MHz. As can be seen from reviewing the data in the table the NCLK frequency varies between 360 and 400 MHz and the NCLK2x frequency varies between 720 and 800 MHz.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing the exemplary embodiment or exemplary embodiments. It should be understood that various changes can be made in the function and arrangement of elements without departing from the scope of the invention as set forth in the appended claims and the legal equivalents thereof.

What is claimed is:

1. A clock generator system, comprising:
   a phase locked loop (PLL) including a first output configured to provide a first clock signal at a first frequency and a second output configured to provide a second clock signal at the first frequency, wherein the second clock signal is out-of-phase with the first clock signal;
   a first clock generator having a first clock input configured to receive the first clock signal, a second clock input configured to receive the second clock signal, a mode signal input configured to receive a first mode signal, and an output, wherein the output of the first clock generator is configured to provide a first generated clock signal whose effective frequency is based on both the first and second clock signals and the first mode signal; and
   a second clock generator having a first clock input configured to receive the first clock signal, a second clock input configured to receive the second clock signal, a mode signal input configured to receive a second mode signal, and an output, wherein the output of the second clock generator is configured to provide a second generated

TABLE 5

| Freq (MHz) | NCLK Div *2 | NCLK (50—50) Freq (MHz) | NCLK2x Freq (MHz) | NCLK2x tCycle (ps) | NCLK2x tH (ps) | NCLK2x tL (ps) | duty cycle = tH/tCycle * 100 |
|---|---|---|---|---|---|---|---|
| 800  | 4  | 400.00 | 800.00 | 1250 | 625 | 625 | 50.00 |
| 900  | 5  | 360.00 | 720.00 | 1389 | 556 | 833 | 40.00 |
| 1000 | 5  | 400.00 | 800.00 | 1250 | 500 | 750 | 40.00 |
| 1100 | 6  | 366.67 | 733.33 | 1364 | 682 | 682 | 50.00 |
| 1200 | 6  | 400.00 | 800.00 | 1250 | 625 | 625 | 50.00 |
| 1300 | 7  | 371.43 | 742.86 | 1346 | 577 | 769 | 42.86 |
| 1400 | 7  | 400.00 | 800.00 | 1250 | 536 | 714 | 42.86 |
| 1500 | 8  | 375.00 | 750.00 | 1333 | 667 | 667 | 50.00 |
| 1600 | 8  | 400.00 | 800.00 | 1250 | 625 | 625 | 50.00 |
| 1700 | 9  | 377.78 | 755.56 | 1324 | 588 | 735 | 44.44 |
| 1800 | 9  | 400.00 | 800.00 | 1250 | 556 | 694 | 44.44 |
| 1900 | 10 | 380.00 | 760.00 | 1316 | 658 | 658 | 50.00 |
| 2000 | 10 | 400.00 | 800.00 | 1250 | 625 | 625 | 50.00 |
| 2100 | 11 | 381.82 | 763.64 | 1310 | 595 | 714 | 45.45 |
| 2200 | 11 | 400.00 | 800.00 | 1250 | 568 | 682 | 45.45 |
| 2300 | 12 | 383.33 | 766.67 | 1304 | 652 | 652 | 50.00 |
| 2400 | 12 | 400.00 | 800.00 | 1250 | 625 | 625 | 50.00 |
| 2500 | 13 | 384.62 | 769.23 | 1300 | 600 | 700 | 46.15 |
| 2600 | 13 | 400.00 | 800.00 | 1250 | 577 | 673 | 46.15 |
| 2700 | 14 | 385.71 | 771.43 | 1296 | 648 | 648 | 50.00 |
| 2800 | 14 | 400.00 | 800.00 | 1250 | 625 | 625 | 50.00 |
| 2900 | 15 | 386.67 | 773.33 | 1293 | 603 | 690 | 46.67 |
| 3000 | 15 | 400.00 | 800.00 | 1250 | 583 | 667 | 46.67 |
| 3100 | 16 | 387.50 | 775.00 | 1290 | 645 | 645 | 50.00 |
| 3200 | 16 | 400.00 | 800.00 | 1250 | 625 | 625 | 50.00 | clock signal whose effective frequency is based on both the first and second clock signals and the second mode signal.

2. The clock generator system of claim 1, wherein the effective frequencies of the first and second generated clock signals are actual frequencies.

3. The clock generator system of claim 1, wherein the second clock signal is a quadrature version of the first clock signal, and wherein the effective frequency of at least one of the first and second generated clock signals is an actual frequency.

4. The clock generator system of claim 1, wherein the first mode signal is configured to provide respective first enable bits for each edge of the first and second clock signals and a level of the respective first enable bits determines the effective frequency of the first generated clock signal, and wherein the second mode signal is configured to provide respective second enable bits for each edge of the first and second clock signals and a level of the respective second enable bits determines the effective frequency of the second generated clock signal.

5. The clock generator system of claim 1, wherein neither the first clock generator nor the second clock generator includes an internal phase locked loop (PLL).

6. The clock generator system of claim 1, wherein the first clock signal is a periodic signal that has a duty cycle of about fifty percent.

7. The clock generator system of claim 1, wherein the effective frequency of the first generated clock signal is different than the effective frequency of the second generated clock signal.

8. The clock generator system of claim 1, wherein the effective frequency of at least one of the first and second generated clock signals is less than the first frequency.

9. The clock generator system of claim 1, wherein the effective frequency of at least one of the first and second generated clock signals is greater than the first frequency.

10. The clock generator system of claim 1, further comprising:
a sequential logic circuit configured to provide the first and second mode signals.

11. The clock generator system of claim 10, wherein the sequential logic circuit is a state machine that comprises:
a first state machine configured to provide the first mode signal; and
a second state machine configure to provide the second mode signal.

12. The clock generator system of claim 11, further comprising:
a power management module in communication with the first and second state machines, wherein the power management module is configured to cause the first state machine to modify the first mode signal in response to a first power state change associated with a first clocked logic circuit and to cause the second state machine to modify the second mode signal in response to a second power state change associated with a second clocked logic circuit.

13. An integrated circuit, comprising:
a phase locked loop (PLL) including a first output configured to provide a first clock signal at a first frequency and a second output configured to provide a second clock signal at the first frequency, wherein the second clock signal is out-of-phase with the first clock signal;
a first clock generator having a first clock input configured to receive the first clock signal, a second clock input configured to receive the second clock signal, a mode signal input configured to receive a first mode signal, and an output, wherein the output of the first clock generator is configured to provide a first generated clock signal whose effective frequency is based on the first and second clock signals and the first mode signal;
a second clock generator having a first clock input configured to receive the first clock signal, a second clock input configured to receive the second clock signal, a mode signal input configured to receive a second mode signal, and an output, wherein the output of the second clock generator is configured to provide a second generated clock signal whose actual frequency is based on the first and second clock signals and the second mode signal;
a static clocked logic circuit having a clock input configured to receive the first generated clock signal; and
a dynamic clocked logic circuit having a clock input configured to receive the second generated clock signal.

14. The integrated circuit of claim 13, further comprising:
a sequential logic circuit configured to provide the first and second mode signals.

15. The integrated circuit of claim 13, wherein the sequential logic circuit is a state machine that comprises:
a first state machine configured to provide the first mode signal; and
a second state machine configure to provide the second mode signal.

16. The integrated circuit of claim 15, further comprising:
a power management module in communication with the first and second state machines, wherein the power management module is configured to cause the first state machine to modify the first mode signal in response to a first power state change associated with the static clocked logic circuit and to cause the second state machine to modify the second mode signal in response to a second power state change associated with the dynamic clocked logic circuit.

17. A method of providing clock signals, comprising:
generating first and second clock signals that are substantially in quadrature with each other;
receiving first and second mode signals corresponding to first and second generated clock signals, respectively;
providing the first generated clock signal at a first effective frequency based on the first and second clock signals and the first mode signal; and
providing the second generated clock signal at a second effective frequency based on the first and second clock signals and the second mode signal.

18. The method of claim 17, wherein the first effective frequency is different than the second effective frequency and the method further comprises:
generating first respective enable bits for each edge of the first and second clock signals for the first mode signal, wherein a level of the respective first enable bits determines the effective frequency of the first generated clock signal; and
generating second respective enable bits for each edge of the first and second clock signals for the second mode signal, wherein a level of the respective second enable bits determines the second effective frequency.

19. The method of claim 17, further comprising:
modifying the first mode signal in response to a first power state change associated with a first clocked logic circuit.

20. The method of claim 19, further comprising:
modifying the second mode signal in response to a second power state change associated with a second clocked logic circuit.

* * * * *